United States Patent
Ahn et al.

[11] Patent Number: 5,837,595
[45] Date of Patent: Nov. 17, 1998

[54] METHODS OF FORMING FIELD OXIDE ISOLATION REGIONS WITH REDUCED SUSCEPTIBILITY TO POLYSILICON RESIDUE DEFECTS

[75] Inventors: Dong-ho Ahn; Min-wook Hwang; Young-woo Park, all of Kyungki-do, Rep. of Korea

[73] Assignee: Samsung Electronics Co., Ltd., Suwon, Rep. of Korea

[21] Appl. No.: 785,999

[22] Filed: Jan. 21, 1997

[30] Foreign Application Priority Data

Jun. 7, 1996 [KR] Rep. of Korea .................. 1996-20369

[51] Int. Cl.$^6$ ..................................................... H01L 21/76
[52] U.S. Cl. ............................................ 438/443; 438/448
[58] Field of Search ..................................... 438/443, 448, 438/229, 230

[56] References Cited

FOREIGN PATENT DOCUMENTS 1-28935  1/1989  Japan .

OTHER PUBLICATIONS

Roth, S.S., et al., "Polysilicon Encapsulated Local Oxidation", IEEE Electron Device Letters, vol. 12, No. 3, pp. 92–94, Mar. 1991.

*Primary Examiner*—George R. Fourson
*Attorney, Agent, or Firm*—Myers, Bigel, Sibley & Sajovec

[57] ABSTRACT

Methods of forming field oxide isolation regions in a semiconductor substrate include the steps of exposing residual polysilicon defects contained within preliminary field oxide isolation regions and then performing a cleaning step to etch and reduce the size of the exposed defects (or eliminate the defects altogether). The preliminary field oxide isolation regions are then oxidized to preferably convert any remaining polysilicon defects into silicon dioxide and then a final oxide etching step is performed to define the shapes of the final field oxide isolation regions. Preferably, a pad oxide layer is formed on a face of a semiconductor substrate and then a masking layer is formed on the pad oxide layer, opposite the face of the substrate. The masking layer is then patterned to define an opening therein which exposes an upper surface of the pad oxide layer. An isotropic etching step is then performed on the pad oxide layer at the exposed upper surface thereof using the patterned masking layer as an etching mask. Polysilicon sidewall spacers are then formed in the opening at the sidewalls of the patterned masking layer. The portion of the substrate extending opposite the opening is then oxidized along with the polysilicon sidewall spacers to thereby define a preliminary field oxide isolation region which potentially contains residues of polycrystalline silicon therein which have not been fully oxidized. The preliminary field oxide isolation region is etched to expose the polysilicon residues. The exposed polysilicon residues are then etched in a cleaning solution to reduce their size and then an oxidation step is performed to convert any remaining portions of the polysilicon residues to silicon dioxide. Finally, the preliminary field oxide isolation region is etched to define a final field oxide isolation region on an electrically inactive portion of the substrate.

10 Claims, 4 Drawing Sheets

METHODS OF FORMING FIELD OXIDE ISOLATION REGIONS WITH REDUCED SUSCEPTIBILITY TO POLYSILICON RESIDUE DEFECTS

FIELD OF THE INVENTION

The present invention relates to semiconductor devices and fabrication methods, and more particularly to methods of forming electrically isolated semiconductor active regions in a semiconductor substrate.

BACKGROUND OF THE INVENTION

Device isolation techniques play an important role in the design and performance of highly integrated semiconductor circuits by electrically isolating regions and devices therein from adjacent devices and regions. Moreover, as the degree of integration in semiconductor circuits increases, there is a concomitant need to develop techniques for forming isolation regions which are free of defects and can be scaled to provide isolation regions having smaller dimensions, but without sacrificing the isolation capability of the regions.

One attempt to electrically isolate adjacent semiconductor active regions from each other is disclosed by FIGS. 1–4. In particular, FIG. 1 shows a step of forming a silicon nitride film pattern 5 and a spacer 9 formed of a polysilicon film. First, pad oxide film and silicon nitride film are sequentially formed on the entire surface of a semiconductor substrate 1. Here, the pad oxide film is formed as a thermal oxide film having a thickness of 100 Å to 200 Å, and the silicon nitride film is formed to have a thickness of 1000 Å to 2000 Å. Next, the silicon nitride film pattern 5 exposing a predetermined region of the pad oxide film is formed by patterning the silicon nitride film. Then, the exposed pad oxide film is etched isotropically to form an undercut region on the lower surface of the edge of the silicon nitride film pattern 5, thereby exposing the semiconductor substrate 1 below the exposed pad oxide film, and, at the same time, a pad oxide film pattern 3 is formed below the silicon nitride film pattern 5. Then, a thin thermal oxide film 7 is formed on the exposed semiconductor substrate 1 by performing a thermal oxidation step. Next, a polysilicon film is formed on the entire surface of the resultant structure on which the thin thermal oxide film 7 is formed, to thus fill the undercut region. A spacer 9 is formed on the lower part of sidewalls of the silicon nitride film pattern 5 by anisotropically etching the formed polysilicon film. Here, in the anisotropic-etching process, an over etching step is performed to form the spacer 9 on the lower part of sidewalls of the silicon nitride film pattern 5.

FIG. 2 shows a step of forming a field oxide film 11. In more detail, a thick field oxide film 11 is formed inside of the silicon nitride film pattern 5 by thermally-oxidizing the resultant structure on which the spacer 9 is formed. At this time, the spacer 9 formed by the polysilicon film is almost oxidized to form a part of the field oxide film 11, whereby the bird's beak formed below edges of the silicon nitride film pattern 5 can be almost prevented. However, the polysilicon film filled in the undercut region described in FIG. 1 is not completely oxidized so that polysilicon residues 9a remain under the silicon nitride film pattern 5 as shown in FIG. 2.

FIG. 3 shows a step of forming a sacrificial oxide film 3a. The resultant substrate on which the field oxide film 11 is formed is dipped in a phosphoric acid ($H_3PO_4$) solution to remove the silicon nitride film pattern 5, whereby the pad oxide film pattern 3 below the silicon nitride film pattern 5 is exposed. Then, the exposed pad oxide film pattern 3 forms a thicker sacrificial oxide film 3a by thermally-oxidizing the resultant structure formed by removing the silicon nitride film pattern 5. At this time, it is preferable that the sacrificial oxide film 3a is formed thinner than or equal to a thickness of 300 Å. If the sacrificial oxide film 3a is formed thicker than 300 Å, the thickness and width of the field oxide film 11 are largely reduced during a sequential process for removing the sacrificial oxide film 3a, thereby deteriorating isolation characteristics. That is, since the sacrificial oxide film 3a is not to be formed too thick, it is impossible to completely oxidize the polysilicon residues 9a. Accordingly, even after forming the sacrificial oxide film 3a, smaller polysilicon residues 9b than the residues 9a still remain.

FIG. 4 shows a step of completing an isolation film 11a. First, the resultant substrate in which the sacrificial oxide film 3a is formed is dipped in an oxide film removal solution (e.g., a fluoric acid solution) to remove the sacrificial oxide film 3a so that the semiconductor substrate 1 below the sacrificial oxide film 3a is exposed. At this time, a thin net isolation film 11a is formed by removing the sacrificial oxide film 3a. As shown in FIG. 4, the polysilicon residue defects 9b are isolated from the field oxide film 11 and adhered to surfaces of the active region (i.e., the exposed semiconductor substrate 1) and the isolation film 11a. As will be understood by those skilled in the art, these remaining residues 9b can significantly adversely effect the electrical device characteristics of devices formed in the active regions.

Thus, notwithstanding the above described method, there continues to be a need for improved methods of forming field oxide isolation regions which are free of residue defects.

SUMMARY OF THE INVENTION

It is therefore an object of the present invention to provide improved methods of forming semiconductor devices having field oxide isolation regions therein.

It is another object of the present invention to provide methods of forming field oxide isolation regions having reduced numbers of defects therein.

These and other objects, features and advantages of the present invention are provided by methods of forming field oxide isolation regions in a semiconductor substrate which include the steps of exposing residual polysilicon defects contained within preliminary field oxide isolation regions and then performing a cleaning step to etch and reduce the size of the exposed defects (or eliminate the defects altogether). The preliminary field oxide isolation regions are then oxidized to preferably convert any remaining polysilicon defects into silicon dioxide and then a final oxide etching step is performed to define the shapes of the final field oxide isolation regions.

In particular, according to one embodiment of the present invention, a pad oxide layer having a thickness in a range between about 100–300 Å is formed on a face of a semiconductor substrate and then a masking layer is formed on the pad oxide layer, opposite the face of the substrate. The masking layer is then patterned to define an opening therein which exposes an upper surface of the pad oxide layer. An isotropic etching step is then performed on the pad oxide layer at the exposed upper surface thereof using the patterned masking layer as an etching mask. Polysilicon sidewall spacers are then formed in the opening at the sidewalls of the patterned masking layer. The portion of the substrate extending opposite the opening is then oxidized along with the polysilicon sidewall spacers to thereby define a preliminary field oxide isolation region which potentially contains residues of polycrystalline silicon therein which have not been fully oxidized. The masking layer is then removed to expose the pad oxide layer and then the preliminary field oxide isolation region is etched to expose the polysilicon residues. The exposed polysilicon residues are then etched in a cleaning solution to reduce their size and then an oxidation step is performed to convert any remaining portions of the polysilicon residues to silicon dioxide. Finally, the preliminary field oxide isolation region is etched to define a final field oxide isolation region on an electrically inactive portion of the substrate. According to this embodiment, the exposed polysilicon residues are preferably etched using a cleaning solution containing ammonium hydroxide ($NH_4OH$), hydrogen peroxide ($H_2O_2$) and deionized water.

DESCRIPTION OF PREFERRED EMBODIMENTS

Figure 1:
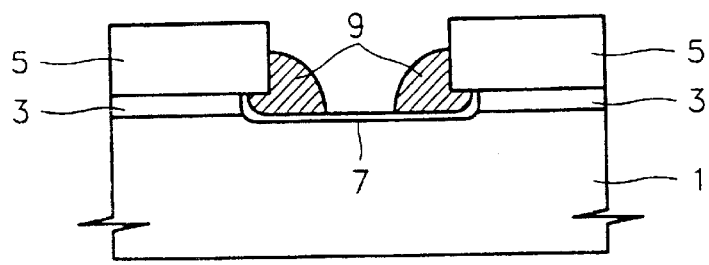
FIGS. 1–4 illustrate schematic cross-sectional views of intermediate structures illustrating a method of forming field oxide isolation regions according to the prior art.
Figure 2:
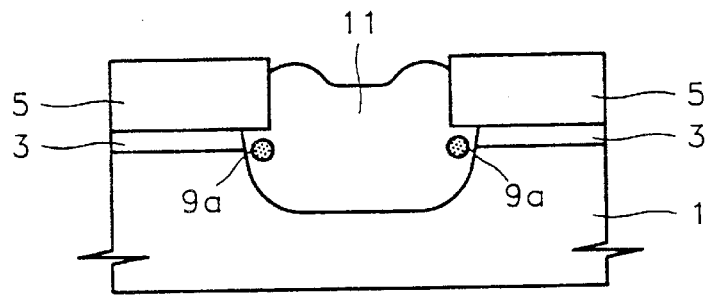
Figure 3:
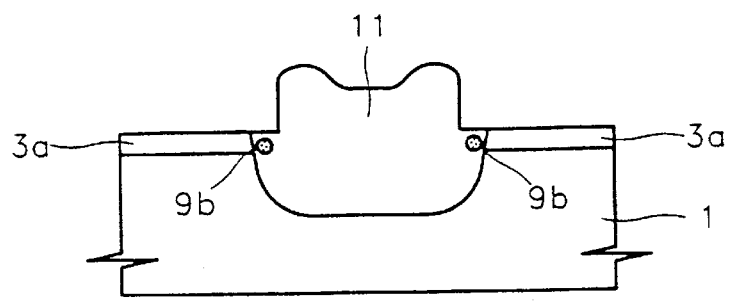
Figure 4:
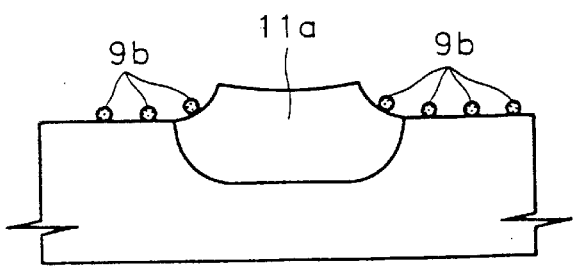

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 5:
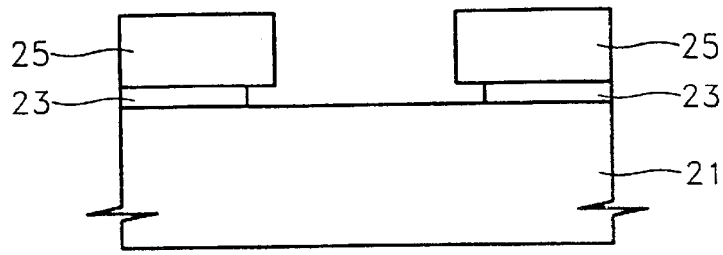
FIGS. 5–9 illustrate schematic cross-sectional views of intermediate structures illustrating a method of forming field oxide isolation regions according to a first embodiment of the present invention.

Referring now to FIGS. 5–9, a preferred method of forming a field oxide isolation region according to a first embodiment of the present invention will now be described. In particular, as best illustrated by FIG. 5, a pad oxide layer 23 (e.g., $SiO_2$) having a thickness in a range between about 100–300 Å is initially formed on a face of a semiconductor substrate 21 using conventional techniques. Then, a masking layer 25 of silicon nitride ($Si_3N_4$) having a thickness in a range between about 1000–2000 Å is formed on an upper surface of the pad oxide layer 23, opposite the face of the substrate. The masking layer 25 is then patterned using conventional techniques to define an opening therein which exposes the pad oxide layer 23. The exposed portion of the pad oxide layer 23 is then isotropically etched to expose the face of the substrate and form undercut regions underneath the edges of the patterned masking layer 25. Here, the isotropic etching step may be performed by wet etching the pad oxide layer 23 using a fluoric acid (HF) solution.

Figure 6:
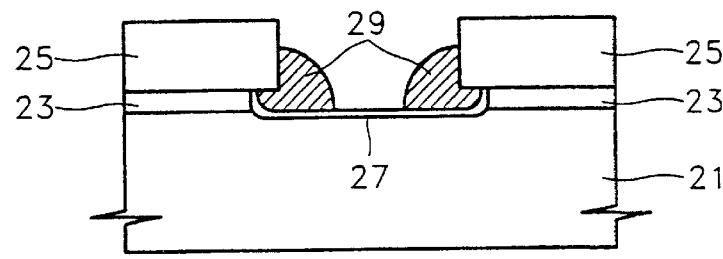
Figure 7:
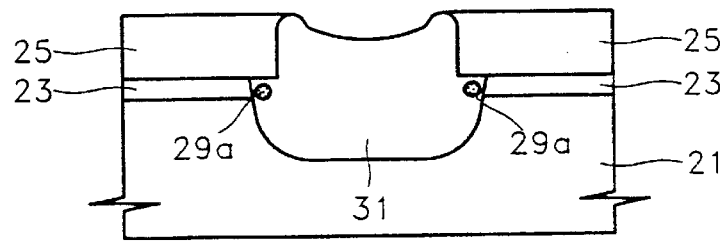
Figure 8:
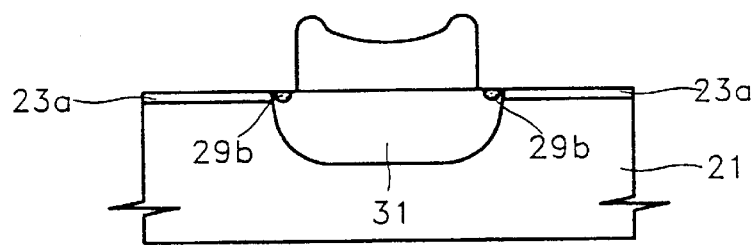

Referring now to FIG. 6, a relatively thin thermal oxide film 27 is then formed on the exposed face of the substrate, as illustrated. The thickness of the thermal oxide film is preferably less than the thickness of the pad oxide layer 23 so that at least portions of the undercut regions remain and are not filled with oxide. A blanket layer of polycrystalline silicon ("polysilicon") is then preferably deposited on an upper surface of the patterned masking layer 25 and in the opening on an upper surface of the thermal oxide film 27. Polysilicon spacers 29 are then formed in the opening defined by the patterned masking layer 25 by anisotropically etching the blanket layer of polysilicon until the upper portions of the sidewalls of the patterned masking layer 25 are exposed as illustrated. Referring now to FIG. 7, a preliminary field oxide isolation region 31 is formed by thermally oxidizing the portion of the substrate 21 extending opposite the opening and the polysilicon spacers 29. At this time, since the preliminary field oxide isolation region 31 is formed by oxidizing the spacers 29 filling the undercut regions, the size of any bird's beak oxide extension formed below the edge of the masking layer 25 can be greatly reduced. Unfortunately, the step of thermally oxidizing the polysilicon spacers 29 may not completely convert the spacers 29 to silicon dioxide and polysilicon residues 29a may remain in the preliminary field oxide isolation region 31 (e.g., in the undercut regions). As illustrated best by FIG. 8, the polysilicon residues may be eliminated by initially removing the masking layer 25 by immersing the masking layer 25 in a phosphoric acid solution ($H_3PO_4$) to expose the pad oxide layer 23. The preliminary field oxide isolation region 31 and pad oxide layer 23 are then etched by a predetermined amount in a range between about 30–100 Å using a fluoric acid solution (HF), to expose the polysilicon residues 29a. This etching step also converts the pad oxide layer 23 into a thin pad oxide layer 23a which extends opposite the active portion of the substrate defined by the preliminary field oxide isolation region 31. Referring still to FIG. 8, the upper surfaces of the preliminary field oxide isolation region 31 and thin pad oxide layer 23a are then exposed to a cleaning solution for a duration in a range between about 10–40 minutes to remove organic material from the surfaces and etch the polysilicon residues 29a so that the remaining residues 29b have reduced size. The cleaning solution is preferably a solution containing ammonium hydroxide ($NH_4OH$), hydrogen peroxide ($H_2O_2$) and deionized water.

Figure 9:
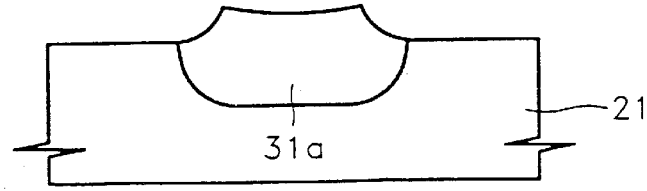

Referring now to FIG. 9, the etched polysilicon residues 29b are then preferably completely oxidized by performing a thermal oxidation step which thickens the preliminary field oxide isolation region 31 and thin pad oxide layer 23a. The preliminary field oxide isolation region and thin pad oxide layer 23a are then etched using an oxide etchant such as fluoric acid (HF). This etching step is preferably performed for a sufficient duration to expose the active portions of the substrate 21 on opposite sides of the field oxide isolation region 31a. Thus, using the above described steps, a relatively thick field oxide isolation region 31a can be achieved which is free of polysilicon residues.

Figure 10:
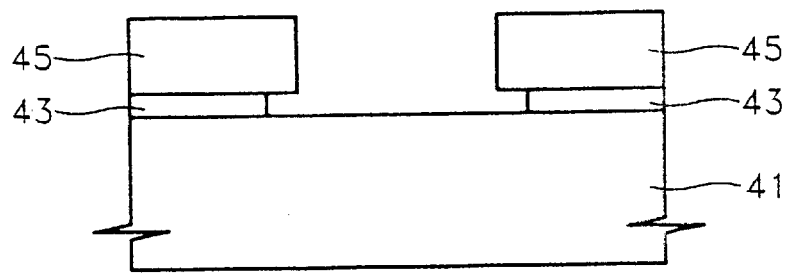
FIGS. 10–15 illustrate schematic cross-sectional views of intermediate structures illustrating a method of forming field oxide isolation regions according to a second embodiment of the present invention.

Referring now to FIGS. 10–15, a preferred method of forming a field oxide isolation region according to a second embodiment of the present invention will now be described. As best illustrated by FIG. 10, a pad oxide layer 43 (e.g., $SiO_2$) having a thickness in a range between about 100–300 Å is initially formed on a face of a semiconductor substrate 41 using conventional techniques. Then, a masking layer 45 of silicon nitride ($Si_3N_4$) having a thickness in a range between about 1000–2000 Å is formed on an upper surface of the pad oxide layer 43, opposite the face of the substrate. The masking layer 45 is then patterned using conventional techniques to define an opening therein which exposes the pad oxide layer 43. The exposed portion of the pad oxide layer 43 is then isotropically etched to expose the face of the substrate and form undercut regions underneath the edges of the patterned masking layer 45. Here, the isotropic etching step may be performed by wet etching the pad oxide layer 43 using a fluoric acid (HF) solution.

Figure 11:
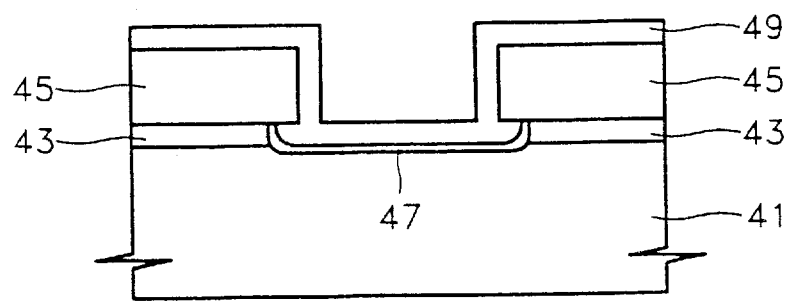
Figure 12:
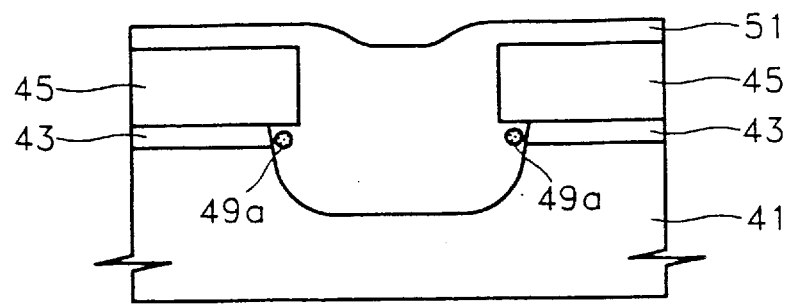
Figure 13:
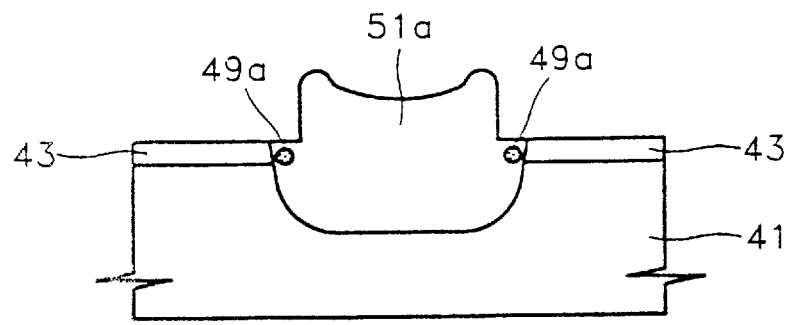
Figure 14:
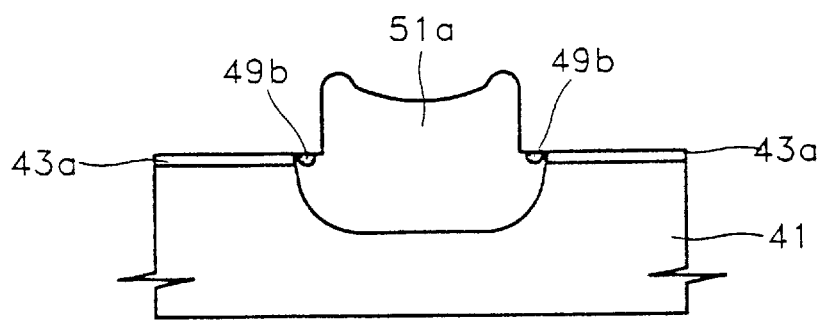

Referring now to FIG. 11, a relatively thin thermal oxide film 47 is then formed on the exposed face of the substrate, as illustrated. The thickness of the thermal oxide film is preferably less than the thickness of the pad oxide layer 43 so that at least portions of the undercut regions remain and are not filled with oxide. A blanket layer of polycrystalline silicon 49 ("polysilicon") is then preferably deposited on an upper surface of the patterned masking layer 45 and in the opening on an upper surface of the thermal oxide film 47. Referring now to FIG. 12, a field oxide isolation layer 51 is formed by thermally oxidizing the portion of the substrate 41 extending opposite the opening and the polysilicon layer 49. At this time, since the field oxide isolation layer 51 is formed by oxidizing the polysilicon layer 49 filling the undercut regions, the size of any bird's beak oxide extension formed below the edge of the masking layer 45 can be greatly reduced. Unfortunately, the step of thermally oxidizing the blanket polysilicon layer 49 may not completely convert the polysilicon layer 49 to silicon dioxide and polysilicon residues 49a may remain in the field oxide isolation layer 51 (e.g., in the undercut regions). As illustrated best by FIGS. 13–14, the polysilicon residues may be eliminated by initially etching the field oxide isolation layer 51 to define a preliminary field oxide isolation region 51a and expose the masking layer 45 and then removing the masking layer 45 by immersing the masking layer 45 in a phosphoric acid solution ($H_3PO_4$) to expose the pad oxide layer 43. The preliminary field oxide isolation region 51a and pad oxide layer 43 are then etched by a predetermined amount in a range between about 30–100 Å using a fluoric acid solution (HF), to expose the polysilicon residues 49a. This etching step also converts the pad oxide layer 43 into a thin pad oxide layer 43a which extends opposite the active portion of the substrate defined by the preliminary field oxide isolation region 51a. Referring still to FIG. 14, the upper surfaces of the preliminary field oxide isolation region 51a and thin pad oxide layer 43a are then exposed to a cleaning solution for a duration in a range between about 10–40 minutes to remove organic material from the surfaces and etch the polysilicon residues 49a so that the remaining residues 49b have reduced size. The cleaning solution is preferably a solution containing ammonium hydroxide ($NH_4OH$), hydrogen peroxide ($H_2O_2$) and deionized water.

Figure 15:
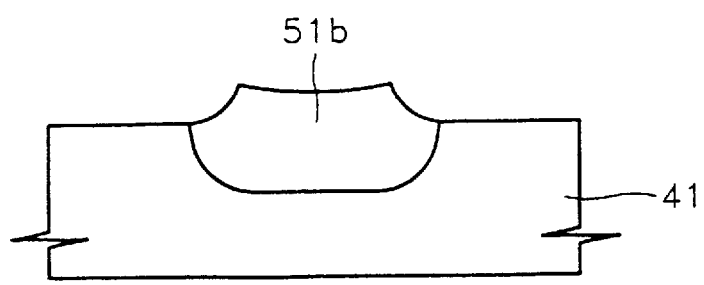

Referring now to FIG. 15, the etched polysilicon residues 49b are then preferably completely oxidized by performing a thermal oxidation step which thickens the preliminary field oxide isolation region 51a and thin pad oxide layer 43a. The preliminary field oxide isolation region 51a and thin pad oxide layer 43a are then etched using an oxide etchant such as fluoric acid (HF). This etching step is preferably performed for a sufficient duration to expose the active portions of the substrate 41 on opposite sides of the field oxide isolation region 51b. Thus, using the above described steps, a relatively thick field oxide isolation region 51b can be achieved which is free of polysilicon residues.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a field oxide isolation region in a semiconductor substrate, comprising the steps of:

forming a pad oxide layer on a face of a semiconductor substrate;

forming a masking layer on the pad oxide layer, opposite the face of the substrate;

patterning the masking layer to define an opening therein which exposes an upper surface of the pad oxide layer;

isotropically etching the pad oxide layer at the exposed upper surface using the patterned masking layer as an etching mask;

forming a region containing silicon in the opening;

oxidizing the substrate and the region containing silicon in the opening to define a preliminary field oxide isolation region containing residues of silicon therein;

removing the masking layer to expose the pad oxide layer;

etching the preliminary field oxide isolation region to expose at least one of the residues of silicon therein;

etching an exposed residue of silicon;

oxidizing the etched residue; and etching the preliminary field oxide isolation region to define a field oxide isolation region.

2. The method of claim 1, wherein said step of etching an exposed residue comprises immersing the exposed residue in a solution containing ammonium hydroxide.

3. The method of claim 1, wherein said step of etching the preliminary field oxide isolation region to expose at least one of the residues comprises etching the preliminary field oxide isolation region in a solution containing HF.

4. The method of claim 3, wherein said step of etching the preliminary field oxide isolation region to expose at least one of the residues comprises etching the preliminary field oxide isolation region and the pad oxide layer simultaneously.

5. The method of claim 4, wherein said step of etching the preliminary field oxide isolation region to define a field oxide isolation region comprises etching the pad oxide layer to expose the face of the semiconductor substrate.

6. The method of claim 4, wherein said step of etching the preliminary field oxide isolation region to expose at least one of the residues comprises removing a layer of oxide having a thickness in a range between about 30 Å and 100 Å from the preliminary field oxide isolation region.

7. The method of claim 5, wherein said step of etching the preliminary field oxide isolation region to expose at least one of the residues comprises removing a layer of oxide having a thickness in a range between about 30 Å and 100 Å from the preliminary field oxide isolation region.

8. The method of claim 7, wherein said step of etching an exposed residue comprises immersing the exposed residue in a solution containing ammonium hydroxide and hydrogen peroxide.

9. The method of claim 3, wherein said step of forming a region containing silicon in the opening comprises depositing a layer of polycrystalline silicon in the opening and then anisotropically etching the deposited layer of polycrystalline silicon to define sidewall spacers containing polycrystalline silicon.

10. The method of claim 3, wherein said step of forming a region containing silicon in the opening comprises depositing a layer of polycrystalline silicon in the opening and on an upper surface of the patterned masking layer; wherein said step of oxidizing the substrate and the region containing silicon in the opening comprises oxidizing the substrate and the region containing silicon in the opening to define a field oxide isolation layer and then etching the field oxide isolation layer to expose an upper surface of the patterned masking layer.

* * * * *